United States Patent [19]

Giarrusso et al.

[11] Patent Number: 5,137,283
[45] Date of Patent: Aug. 11, 1992

[54] THERMALLY CONDUCTIVE GASKET DEVICE

[75] Inventors: Richard A. Giarrusso, New Foundland; Steven V. Axelband, Teaneck; Robert C. Ullrich, Clifton, all of N.J.

[73] Assignee: ITT Corporation, New York, N.Y.

[21] Appl. No.: 722,858

[22] Filed: Jun. 27, 1991

[51] Int. Cl.⁵ .................................................. F16J 15/02
[52] U.S. Cl. ........................................... 277/1; 277/22; 277/26; 277/9; 277/235 R; 285/187; 29/447
[58] Field of Search ................ 285/187; 277/1, 22, 277/26, 9, 235 R, 235 A; 220/359, 424, 460, 450, 455; 29/402.02, 447

[56] References Cited

U.S. PATENT DOCUMENTS

| | | | |
|---|---|---|---|
| 1,211,476 | 2/1917 | Miller | 277/26 |
| 3,299,905 | 1/1967 | Smirra | 277/22 |
| 3,897,087 | 7/1975 | Nielson | 285/18 |
| 4,061,344 | 12/1977 | Bradley et al. | 285/187 X |
| 4,441,721 | 4/1984 | Harris et al. | 277/26 |
| 4,485,138 | 11/1988 | Yamamoto et al. | 277/DIG. 6 X |
| 4,487,432 | 12/1984 | Passerell et al. | 285/15 |
| 4,776,602 | 10/1988 | Gallo | 277/233 |
| 4,817,963 | 4/1989 | Munden et al. | 277/1 |

FOREIGN PATENT DOCUMENTS

| | | | |
|---|---|---|---|
| 0101361 | 6/1985 | Japan | 277/26 |
| 0155377 | 7/1987 | Japan | 277/22 |
| 0270977 | 11/1988 | Japan | 277/26 |

*Primary Examiner*—William A. Cuchlinski, Jr.
*Assistant Examiner*—James K. Folker
*Attorney, Agent, or Firm*—Arthur L. Plevy

[57] ABSTRACT

A gasket is formed by encapsulating a thermally conductive low melting temperature material or core in a plastic skin. The low melting temperature material conforms to the shape of the interface completely filling all voids once heated above its melting temperature. Since the low melting temperature material is encapsulated in a plastic skin, there is no danger of contaminating parts of the assembly. The gasket is easily applied and removed in all applications, is re-usable, and the thickness can be as thin as 0.010 inches.

20 Claims, 3 Drawing Sheets

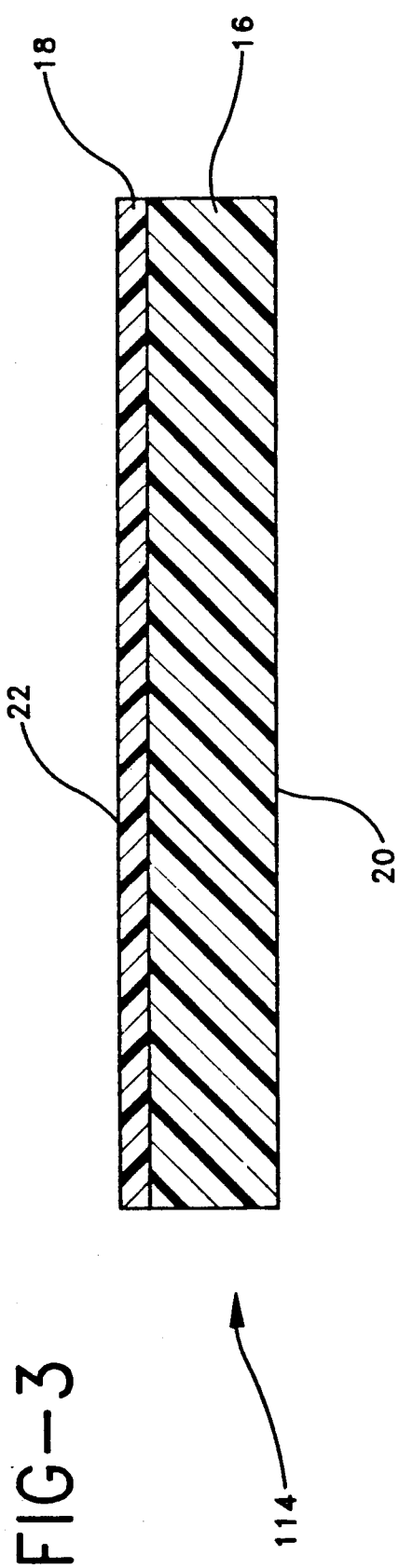
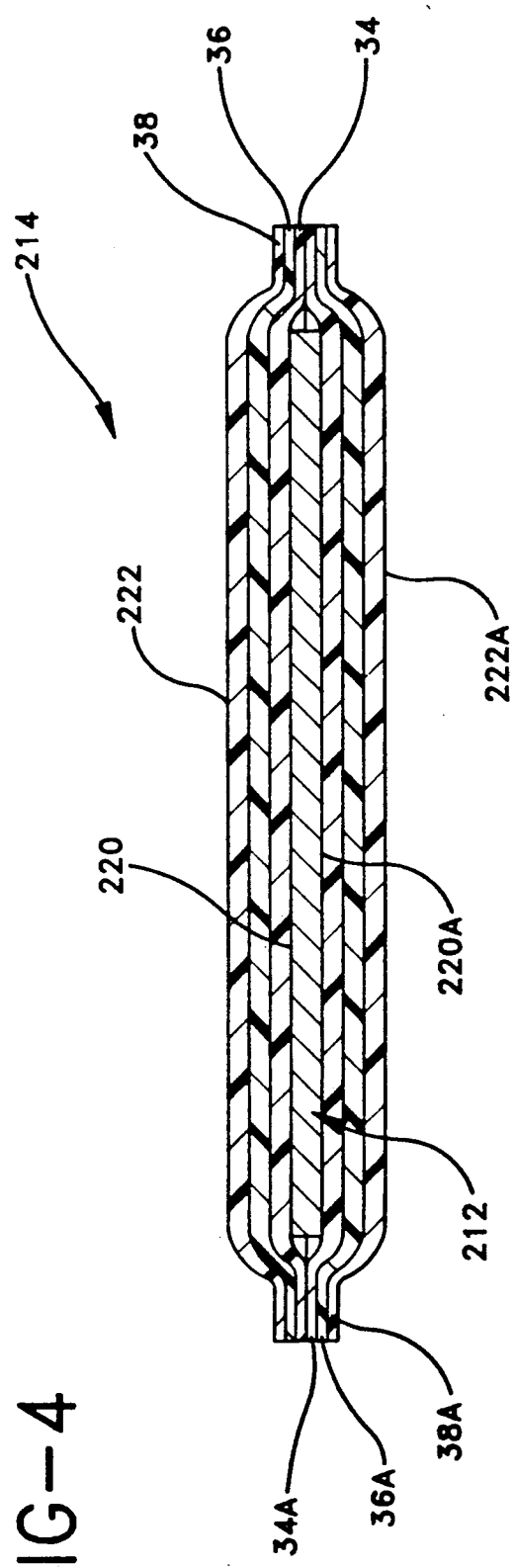

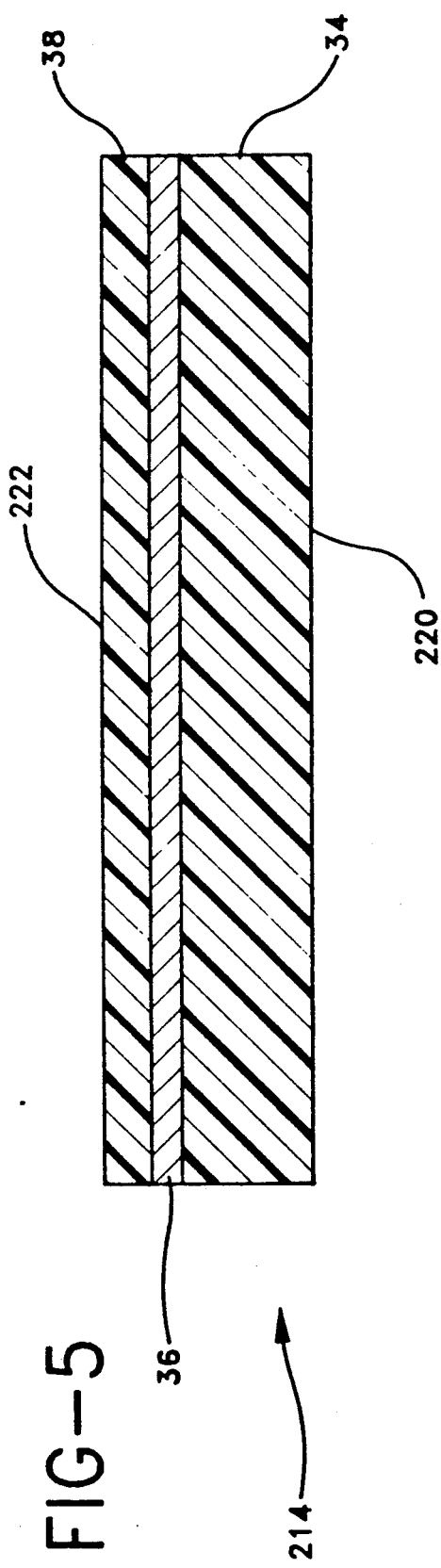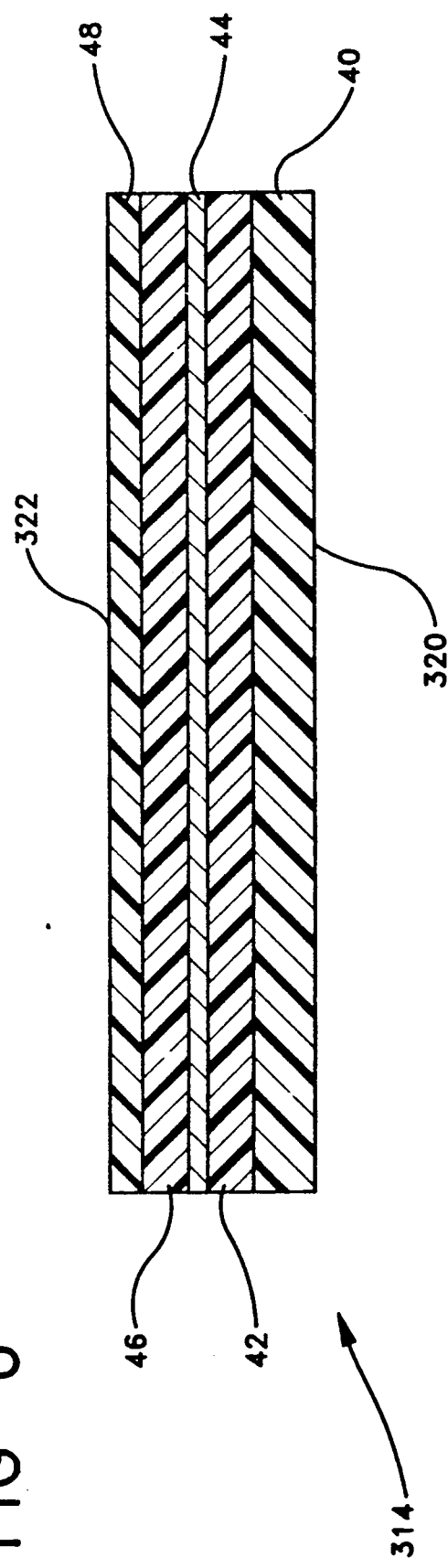

THERMALLY CONDUCTIVE GASKET DEVICE

FIELD OF THE INVENTION

This invention relates generally to a thermal interface and, more particularly, to a conductive gasket that reduces the temperature gradient between two surfaces.

BACKGROUND OF THE INVENTION

Conventional thermal interface media reduce the temperature gradient between two different surfaces in close proximity with one another. The surfaces are typically mating surfaces. The conventional interface media are positioned in the gaps or voids between the two surfaces so that the thermal resistance is lowered thereby allowing the heat to flow away from the hotter surface. The efficient flow of heat will be impeded if any gaps or voids remain at the interface surfaces. Examples of conventional interface media are thermal grease and silicone pads (thermal gaskets).

However, existing interface media have some undesirable characteristics. In particular, thermal grease is difficult to apply properly and when applied too thick, the heat transfer performance degrades. Unwanted material, such as machining chips, tend to collect in the grease so that even larger gaps are produced which can also reduce heat transfer performance. In addition, thermal grease cannot be completely removed without leaving a residue even when cleaned with a solvent. Moreover, thermal grease will contaminate solder joints if the grease gets on surfaces that are to be soldered. The conventional thermal gaskets have limited compressability (10% to 20%), and therefore, thick sections of the gasket are required to fill even small voids. Unfortunately, thick thermal gaskets have poor heat transfer qualities.

An example of a conventional thermally conductive gasket is found in U.S. Pat. No. 4,776,602 which issued on Oct. 11, 1988 to Paul E. Gallo. The gasket device includes a metallic core with an upper and lower face. The core is fabricated from tin plated stainless or low carbon steel. A thermally conductive expandable graphite material, such as aluminum foil, contacts with the upper face. A pair of compressible non-asbestos facing layers are disposed on opposing sides of the core and are comprised of clay, rubber and aramid fibers. Tangs are formed in the core to clinch together all the layers in the device.

U.S. Pat. No. 4,485,138, which issued on Nov. 27, 1984 to T. Yamamoto, et al., discloses a heat-resistant sheet gasket for an automobile engine. The gasket includes a thin, metal sheet core surrounded by a flexible elastomer layer. The metal core may be fabricated from cold-rolled steel plate. The layer is fabricated from a milled blend of short rubber fibers, long polymeric fibers and thermally conductive particles to accelerate heat dissipation. Clay fillers may be added to the blend to reinforce the rubber. Pressure is applied to both sides of the metal core to laminate the blend afterwhich the blend is vulcanized.

U.S. Pat. No. 4,451,047, which issued on May 29, 1984 to David P. Herd, et al., discloses a seal for a stem gate valve. The seal includes a pair of frustoconical metal ring gaskets between which two identical make-up rings of Teflon are disposed. The metal ring gaskets may be fabricated from stainless steel or from other metals such as carbon or alloy steel. A core ring of compacted graphite is provided between the make-up rings. A bearing ring is positioned around the inner periphery of the core ring between the core ring and the valve activating stem. The bearing ring is fabricated from a polytetrafluoroethylene sold under the trademark TEFLON or a polytetrafluoroethylene with molybdenum disulfide sold under the trademark MOLY-TEFLON material. The material for forming the make-up and bearing rings should be sufficiently elastic to flow into any minute gaps existing between the metal ring gaskets and the valve stem and stuffing box.

U.S. Pat. No. 4,428,593, which issued on Jan. 31, 1984 to Robert S. Pearlstein, discloses a gasket assembly for an internal combustion engine. The assembly includes a solid, expensive metal core of cold-rolled steel which has opposed planar sides. A compressible gasket material, which may be fiber reinforced, is laminated to the planer sides. The gasket material may include asbestos, glass fibers, etc. and may also include nitrile, peoprene or polyacrylic elastomers as a binder. Beads of silicone sealant are arranged on the core surfaces beneath the gasket material at those areas where increased sealing forces are expected. A second embodiment discloses a pair of gasket layers formed from the materials used in the aforementioned gasket material. The layers adhere to an elastomeric sealing pattern. Alternatively, the sealing material may include metal, ceramics or plastic preforms. The layers may be bonded closely about the pattern.

As one can ascertain, the above assemblies are relatively complicated, difficult to fabricate and to use. Certain of the devices are relatively thick and inefficient in operation.

SUMMARY OF THE INVENTION

In accordance with the present invention, a thermally conductive gasket is provided consisting of a thermally conductive metal core material encapsulated in a thin skin member. The metal core material is selected having a melting temperature lower than that of the skin member. The skin member may be fabricated from multiple layers of plastic and/or metal.

The encapsulated metal material flows when the gasket is subjected to a given temperature at an interface medium. Any voids and irregularities at the interfaces will be filled once the metal core material is heated above its melting temperature. The molten metal core material will remain encapsulated within the skin member due to the higher temperature of the skin. Therefore, contamination or disturbance of the interface is eliminated. In addition, the gasket is easily applied and removed and is re-usable. Fabrication of the gasket is simple and inexpensive and may be designed in a wide range of sizes depending on the interface requirements. The gasket is extremely thin as compared to prior art devices.

BRIEF DESCRIPTION OF THE FIGURES

FIG. 3 is a cross-sectional side view of a plastic sheet which can be employed in the present invention;

FIG. 4 is a cross-sectional side view of a gasket constructed in accordance with still another embodiment of the present invention;

FIG. 5 is a partial side view of a cross-section of another sheet employed in FIG. 4; and FIG. 6 is a partial side view of a cross-section of still another sheet.

DETAILED DESCRIPTION OF THE FIGURES

Figure 1:
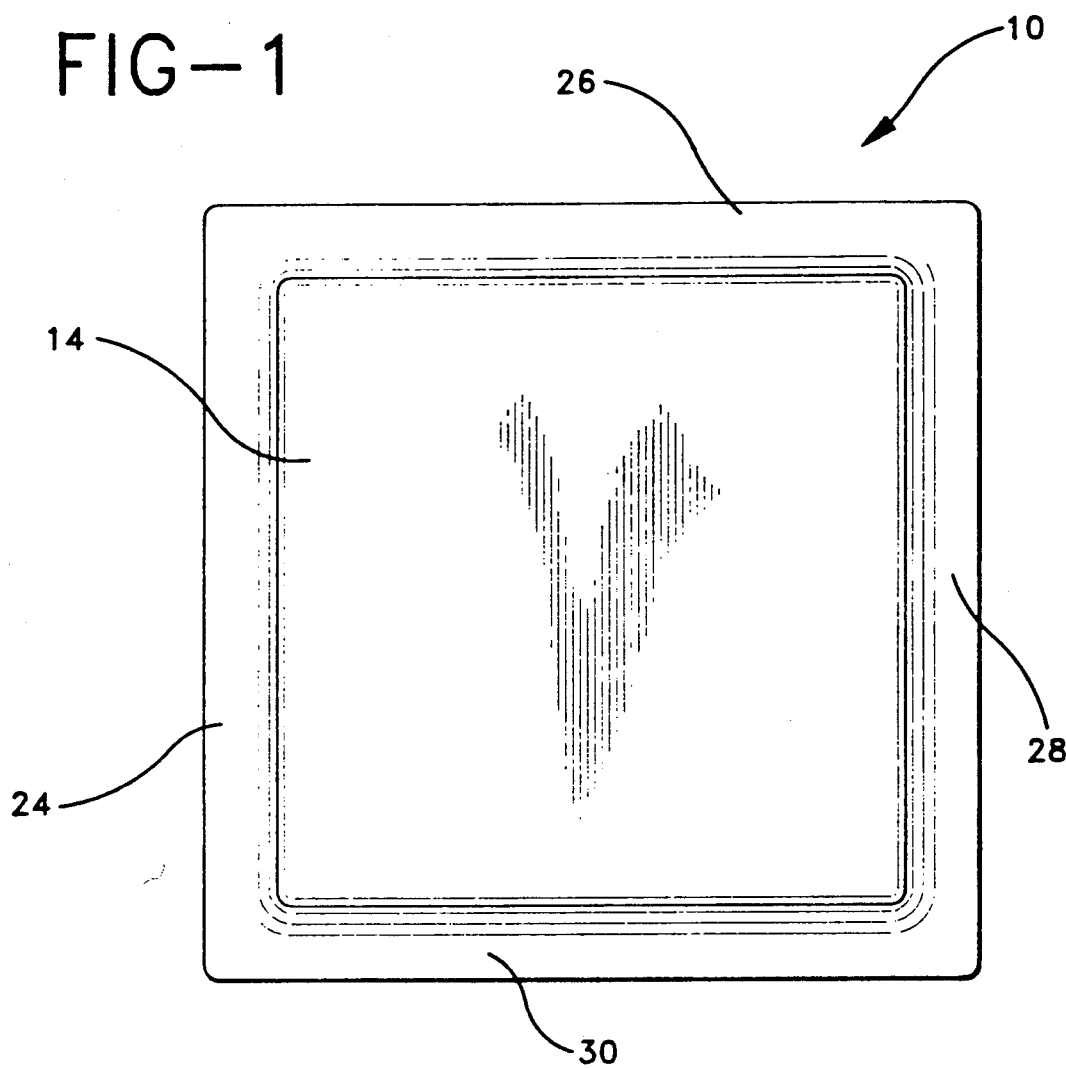
FIG. 1 is a top view of a gasket constructed in accordance with the present invention.
Figure 2:
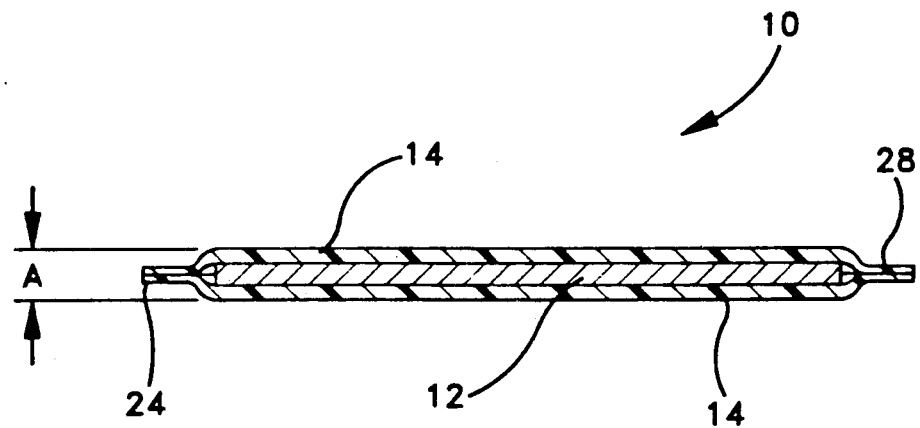
FIG. 2 is a side view of the gasket shown in FIG. 1.

Referring to FIGS. 1 and 2, a thermally conductive gasket 10 is shown. The gasket 10 is formed by encapsulating a thermally conductive low melting temperature material 12 in a metal or plastic skin member 14. The skin employed may be a high temperature plastic such as a polyamide sold under the trademark KAPTON coated with polytetrafluoroethylene sold under the trademark TEFLON or other high temperature plastics or composites. The low melting temperature core material 12 conforms to the shape of the interface (not shown) completely filling all voids once heated above its melting temperature. Since the low melting temperature core material 12 is encapsulated in the plastic member 14, there is no danger of contaminating parts of the interface assembly. The gasket 10 is easily applied and removed in all applications, is reusable, and can be as thin as 0.01 inches. A vacuum can be applied in the internal chamber where the core of metal material 12 is encapsulated. The skin member may be fabricated from top and bottom plastic layered sheets which are then secured together at the peripheral edges 24, 26, 28, 30 to encapsulate the low melting temperature core material 12 within the housing thus formed.

The core 12 of metal material is thermally conductive and has a lower melting temperature than the encapsulating material 14. The metal material may be a lead-bismuth alloy or a cerro-alloy, such as those manufactured by the Cerro Metal Products Company of Pennsylvania and marketed under the trademark Cerrobend and Cerrosafe. Such alloys are preferred for their softness and low melting point. For example, Cerrobend is composed of 50% bismuth, 26.7% lead, 13.3% tin and 10% cadmium and has a melting point of 158 degrees Fahrenheit. Cerrosafe is composed of 42.5% bismuth, 37.7% lead, 11.3% tin and 8.5% cadmium and has a melting point of from 160 degrees to 190 degrees Fahrenheit. The core material 12 has a thickness of approximately 0.010 inches.

The sheet 114 (FIG. 3) consists of an inner or seal layer 16 and an outer layer 18. The inner layer 16 and the outer layer 18 are bonded together in any conventional manner. The inner layer 16 is preferably a low density polypropylene (LDP) which faces and contacts the encapsulated metal material along the surface 20. The thickness of the inner layer is 0.002 inches and seals the gasket from the inside as will be discussed hereinafter. The outer layer 18 is fabricated from a polyester material with a thickness of 0.0005 inches. The outer layer is formed with an outer surface 22 polytetrafluoroethylene sold under the trademark TEFLON for contacting the interface (not shown). Alternatively, the inner layer may be polytetrafluoroethylene sold under the trademark TEFLON with a thickness of 0.001 inches and the outer layer may be another polyamide film sold under the trademark KAPTON, with a thickness of 0.001 inches.

The skin member as formed from the sheets 14 and encapsulates the metal core 12 along corresponding borders 24, 26,28,30 (FIG. 1). The gasket 10 can be sealed by heating the borders to the fusion temperature corresponding the sealing material (650° F. is for polytetrafluoroethylene sold under the trademark TEFLON, 350°-375° for (LDP)). This will cause each inner layer 16 (FIG. 3) to melt and fuse together. Furthermore, the core material may be maintained in a vacuum. The thickens "A" (FIG. 2) of the gasket device 10 is in a range of from 0.01 to 0.020 inches.

FIG. 5 shows an additional layered sheet configuration 214 consisting of three layers 34,36,38. The inner or seal layer 34 is formed from LDP and has an inner surface 220 which will face the core material. The inner layer 34 is approximately 0.003 inches thick. A middle layer 36 of aluminum foil extends along and is secured to the LDP layer 34 and has a thickness of approximately 0.0005 inches. An outer layer 38 is formed from polyester and has an outer surface 222 for contact to an interface (not shown). The outer layer is secured to the middle layer and is 0.001 inches thick. The layers 34,36,38 are bonded together in any conventional manner. The inner surface 220 of each corresponding layer 34 is subjected to heat to fuse the layers 34, of respective sheets together. FIG. 4 shows a gasket formed from two sheets of FIG. 5 which are secured at their edges by means of the layers 34. In the chamber formed by securing the sheets together is the low melting point metal or material 212. The thickness of the gasket constructed in accordance with the third embodiment and including the thickness of the core material is 0.019 inches.

Another embodiment of a thermally conductive gasket constructed in accordance with the present invention is illustrated in FIG. 6 Elements illustrated in FIG. 6 which correspond to the elements described above with respect to FIGS. 1 and 2 have been designated by corresponding reference numerals increased by three hundred. The embodiment of FIG. 6 is designed for use in the same manner as the embodiment or FIGS. 1 and 2 unless otherwise noted.

FIG. 6 shows a portion of sheet 314 which includes five layers 40,42,44,46,48. The inner seal layer 40 is linear low density polypropylene (LLDP) and is provided with the inner surface 320 for facing the core material 12. The inner layer 40 is 0.0015 inches thick. The outer layer 48 is biax nylon and has an outer surface 322 for contacting the interface (not shown). The outer layer has a thickness of 0.00065 inches. A pair of intermediate layers 42, 46 is disposed between the inner and outer layers 40,48. Each of layers 42,46 is formed from LDP with a thickness of 0.001 inches. The layer 42 is secured to the layer 40. The center layer 44 is secured between the layers 42, 46 and is formed of aluminum foil with a thickness of 0.00035 inches. The layer 48 is secured to the layer 46. The overall thickness of a gasket formed from this sheet including the thickness of the core material 12 is 0.019 inches. The core 12 may have a vacuum maintained therein.

The amount of metal material in the core 12 is determined upon the volume of the internal chamber that remains after the plastic member is sealed closed. The metal material is preferably introduced into the space in powdered form. This simplifies production of the gasket device and provides for more rapid melting of the metal material during its initial use. In addition, there is less of a chance that the sheet will be ruptured if the metal is introduced into the space in powdered form.

The gasket device is intended for use in electrical components and assemblies, although it can be used with any interface emitting heat below the melting point of the skin and above the melting point of the core. For example, the thermally conductive gasket 10 can be positioned between a traveling wave tube ("TWT") and a cold plate. When the gasket is placed between the TWT and the cold plate, the heat emitted from the TWT will melt the core material and cause the material to flow filling voids and irregularities. When the TWT is forced down onto the cold plate, the seal is sufficiently strong to prevent rupture of the assembly.

Because the metal material core is encapsulated within the skin 14, there is no danger of the material contaminating or tainting the interfaces and the related assemblies. The gasket device 10 is easily applied and removed in all applications and is re-usable.

It will be understood that the embodiment described herein is merely exemplary and that a person skilled in the art may make many variations and modifications without departing from the spirit and scope of the invention. All such modifications and variations are intended to be included within the scope of the invention as defined in the appended claims.

We claim:

1. A thermally conductive gasket of the type employed for use between interfaces, comprising a pliable gasket member having an internal chamber and fabricated from a material capable of withstanding a given temperature, and a low melting temperature core having a melting temperature less than said given temperature, said core being positioned within said internal chamber in which a vacuum is provided, whereby when said gasket is employed at a temperature sufficient to cause said core material to melt, said material flows and conforms to voids in said interfaces between which said gasket is employed.

2. A gasket according to claim 1, wherein said internal chamber is vacuumized.

3. A gasket according to claim 1, wherein said pliable gasket member is formed from a high temperature plastic.

4. A gasket according to claim 1, wherein said pliable gasket member is formed from a first planar member and a second planar member, said first and second planar members being joined to one another at their peripheral edges.

5. A gasket according to claim 4, wherein said first and second planar members are each formed from an inner and outer planar member.

6. A gasket according to claim 5, wherein said inner planar member is formed from polytetrafluorethylene.

7. A gasket according to claim 5, wherein said inner planar member is formed from polypropylene.

8. A gasket according to claim 7, wherein said polypropylene is formed having a low density.

9. A gasket according to claim 1, wherein said low melting temperature core is formed from an alloy of the lead-bismuth type.

10. A gasket according to claim 9, wherein said alloy is formed from bismuth, lead and tin.

11. A gasket according to claim 5, wherein each of said first and second planar members includes a center layer secured between said inner and outer planar members.

12. A gasket according to claim 11, wherein said center layer is formed from aluminum foil.

13. A gasket according to claim 11, wherein each of said first and second planar members further include first and second intermediate layers, said first intermediate layer being secured between said inner layer and said center layer, and said second intermediate layer being disposed between said outer layer and said center layer.

14. A gasket according to claim 13, wherein said inner layer is formed from linear low-density polypropylene, said outer layer is formed from a biax nylon, said first and second intermediate layers are formed from polypropylene and said center layer is formed from aluminum foil.

15. A gasket according to claim 1, wherein said gasket is employed at an interface between a heat emitting electronic device and a heat sink.

16. A gasket according to claim 1, wherein said core material is positioned in said internal chamber in a powdered form.

17. A gasket according to claim 1, wherein said gasket is re-usable for a successive application at another interface.

18. A gasket according to claim 1, wherein said metal core will melt and flow at a temperature as low as 158 degrees Fahrenheit.

19. A thermally conductive gasket of the type employed for use between interfaces, comprising first and second pieces of planar material, each of said first and second pieces being pliable and having an inner and outer surface, said inner surfaces being positioned to face each other and joined about the periphery such that an internal chamber is formed between said first and second pieces, and a metal core having a melting temperature less than said first and second pieces, said core being positioned within said internal chamber in which a vacuum is also provided, whereby said core is encapsulated between said first and second pieces of planar material.

20. A method of providing a thermal interface between two mating surfaces, comprising the steps of:
a) placing a low melting temperature material in a chamber in which a vacuum is provided and formed within a high temperature pliable housing;
b) positioning said pliable housing between said surfaces; and
c) heating said gasket to a sufficient temperature to cause said low melting temperature material to melt and to therefore flow and conform to voids in said interface between which said gasket is employed.

* * * * *